(12) United States Patent
Akiba et al.

(10) Patent No.: US 7,132,311 B2
(45) Date of Patent: Nov. 7, 2006

(54) ENCAPSULATION OF A STACK OF SEMICONDUCTOR DICE

(75) Inventors: Masayuki Akiba, Ibaraki-ken (JP); Kinya Ichikawa, Ibaraki-ken (JP); Jiro Kubota, Ibaraki-ken (JP); Takashi Kumamoto, Ibaraki-ken (JP)

(73) Assignee: Intel Corporation, Santa Clara, CA (US)

( * ) Notice: Subject to any disclaimer, the term of this patent is extended or adjusted under 35 U.S.C. 154(b) by 456 days.

(21) Appl. No.: 10/206,007

(22) Filed: Jul. 26, 2002

(65) Prior Publication Data

US 2004/0016939 A1 Jan. 29, 2004

(51) Int. Cl.
*H01L 21/56* (2006.01)
(52) U.S. Cl. ...................... 438/109; 438/126
(58) Field of Classification Search ............... 438/106, 438/108, 109, 127; 264/272.17; 257/687
See application file for complete search history.

(56) References Cited

U.S. PATENT DOCUMENTS

| | | | |
|---|---|---|---|
| 5,012,323 A | 4/1991 | Farnworth | |
| 5,019,893 A | 5/1991 | Frank et al. | |
| 5,385,869 A * | 1/1995 | Liu et al. | 29/841 |
| 5,530,292 A * | 6/1996 | Waki et al. | 257/724 |
| 5,717,252 A | 2/1998 | Nakashima et al. | |
| 5,793,101 A * | 8/1998 | Kuhn | 257/676 |
| 5,856,705 A * | 1/1999 | Ting | 257/758 |
| 5,874,773 A * | 2/1999 | Terada et al. | 257/676 |
| 5,939,779 A | 8/1999 | Kim | |
| 6,020,629 A * | 2/2000 | Farnworth et al. | 257/686 |
| 6,075,284 A | 6/2000 | Choi et al. | |
| 6,081,997 A | 7/2000 | Chia et al. | |
| 6,093,938 A | 7/2000 | Minemier et al. | |
| 6,111,306 A | 8/2000 | Kawahara et al. | |
| 6,229,158 B1 | 5/2001 | Minemier et al. | |
| 6,232,667 B1 * | 5/2001 | Hultmark et al. | 257/777 |
| 6,252,299 B1 * | 6/2001 | Masuda et al. | 257/724 |
| 6,271,056 B1 | 8/2001 | Farnworth et al. | |
| 6,297,548 B1 | 10/2001 | Moden et al. | |
| 6,316,825 B1 | 11/2001 | Park et al. | |
| 6,362,022 B1 | 3/2002 | Hinkle et al. | |
| 6,362,966 B1 | 3/2002 | Ali et al. | |
| 6,404,062 B1 * | 6/2002 | Taniguchi et al. | 257/778 |
| 6,407,456 B1 | 6/2002 | Ball | |
| 6,445,077 B1 | 9/2002 | Choi et al. | |
| 6,472,758 B1 * | 10/2002 | Glenn et al. | 257/777 |
| 6,501,173 B1 * | 12/2002 | Nishizawa et al. | 257/723 |
| 6,552,419 B1 | 4/2003 | Toyosawa | |

(Continued)

FOREIGN PATENT DOCUMENTS

JP 2000260912 9/2000

OTHER PUBLICATIONS

Microchip Fabrication—Fourth Edition, pp. 578-579 (Molded Enclosures), Copyright 2000, by Peter Van Zant.*

*Primary Examiner*—Stephen W. Smoot
(74) *Attorney, Agent, or Firm*—Blakely, Sokoloff, Taylor & Zafman LLP

(57) ABSTRACT

Systems and methods for encapsulating a stack of semiconductor dice are described. A stack of semiconductor dice may be formed, for example by attaching die to flexible printed circuit supports attached to frames and stacking the supports, and then encapsulated by flowing a liquid encapsulant around the stack of dice and solidifying the liquid encapsulant. The die supports may contain encapsulant flow openings, such as rectangular slits, that allow the liquid encapsulant to flow around the stack of dice.

27 Claims, 17 Drawing Sheets

U.S. PATENT DOCUMENTS

| | | |
|---|---|---|
| 6,730,544 B1 | 5/2004 | Yang |
| 6,777,789 B1 | 8/2004 | Glenn et al. |
| 2001/0006258 A1 | 7/2001 | Hur |
| 2002/0127770 A1* | 9/2002 | Vaiyapuri .................. 438/107 |
| 2003/0001252 A1* | 1/2003 | Ku et al. .................... 257/686 |
| 2003/0080441 A1 | 5/2003 | Bolken |
| 2003/0201524 A1 | 10/2003 | Murakami et al. |
| 2004/0171179 A1* | 9/2004 | Farnworth et al. ............ 438/15 |

* cited by examiner

ENCAPSULATION OF A STACK OF SEMICONDUCTOR DICE

BACKGROUND

1. Field

An embodiment of the invention relates to a device having more than one semiconductor die. More particularly, the embodiment relates to a device having an encapsulated stack of semiconductor dice, and to a method for forming the device.

2. Background

Semiconductor based electronic components of many modern electrical systems are often provided as multiple die packages wherein two or more electrically connected semiconductor die are packaged together. FIG. 1 shows a prior art package 100 containing a stack of separately molded silicon die. The package contains a first substrate 110, a first silicon die 120, a first epoxy molding compound 130 globbed over the first die, a second substrate 150, a second silicon die 160, a second epoxy molding compound 170 globbed over the second die, and solder balls 140 to provide electrical connection between the first and the second silicon die. The second die is stacked over the first die after the molding compounds have been separately globbed over the dice.

Stacked die packages, such as the one shown, offer a number of advantages. One advantage is an ability to separate the functions on each semiconductor die. For example, the first die 120 may contain primarily logic and the second die 160 may contain primarily memory. This separation of functions may simplify fabrication and may improve fabrication yields, inasmuch as the yields of logic die are often less than those of memory die. A further advantage of such packages is that they are compact, have high circuit density, and have low footprint area. This makes these packages particularly useful for providing electronic components and functions for compact electrical systems, such as cellular phones and the like. For these and other reasons, stacked semiconductor dice packages are favored for many modern and commercially significant electronic devices.

Unfortunately, the prior art package 100 and the existing methods for fabricating such a package have a number of disadvantages. One significant disadvantage is that the fabrication method is generally inefficient and contains a number of unnecessary operations. In fabricating the prior art package, each of the die are molded separately to their respective substrates. That is, molding compound 130 is globbed over the first die 120 attached to the first substrate 110, and then, separately, molding compound 170 is globbed over the second die 160 attached to the second substrate 150. Performing these moldings separately often involves either the use of additional/replicate molding equipment, which may increase the manufacturing costs, or else a decrease in manufacturing throughput if the same equipment is used. Additionally, numerous handling operations may need to be performed by operators or machines in order to move the multiple attached die into and out of the molding equipment. Also as a consequence of the separate molding operations, the thickness and regularity of the thickness of the molding compounds 130 and 170 are generally insufficient to allow electrical connection through the solder balls. Accordingly, in the prior art fabrication methods, planarization operations are often used to planarize the top surface of the molding compounds at heights that are similar to the height of the solder balls. Another operation that is often performed in the prior art fabrication method is application of an adhesive to adhere the first molding compound 130 to the second support 150, since the molding compounds are hardened before contact and provide no mechanical connection. Each of these operations may add to the overall cost of packaging the device.

Additionally, even after planarization, the molding compounds often significantly increase the overall thickness of the package. Often, this will not be desired, particularly if the package is to be used in a cellular phone or other small device.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

Described herein are systems and methods for encapsulating a stack of semiconductor dice. In the following description, numerous specific details are set forth. However, it is understood that embodiments of the invention may be practiced without these specific details. In other instances, well-known circuits, structures and techniques have not been shown in detail in order not to obscure the understanding of this description.

Figure 2:
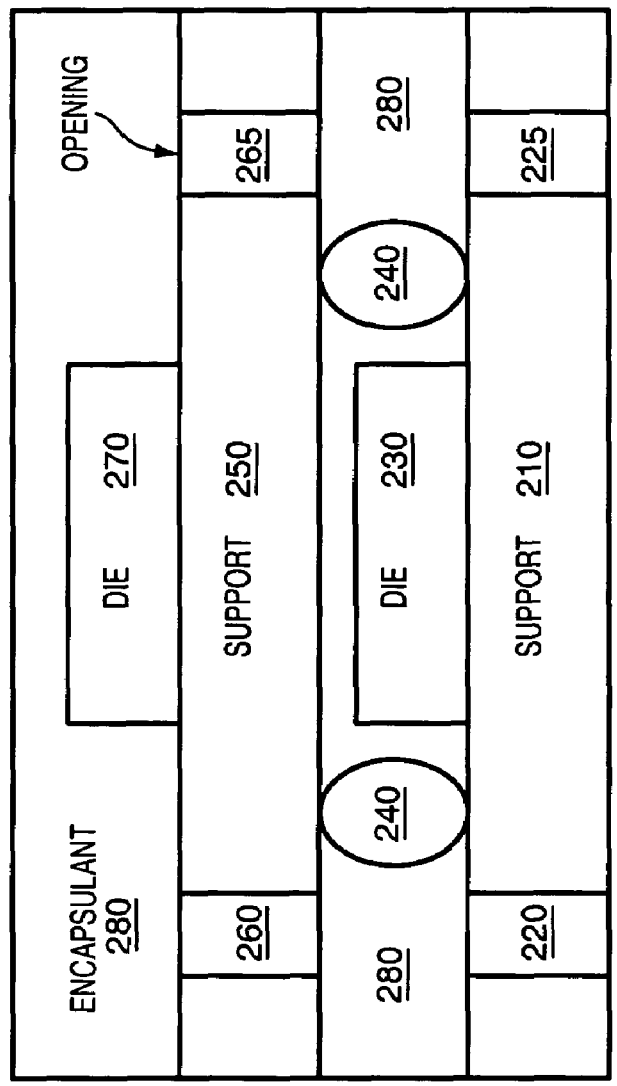
FIG. 2 shows a cross-sectional view of an integrated circuit device containing an encapsulated stack of dice, according to one embodiment of the present invention.

FIG. 2 shows a cross-sectional view of an integrated circuit device containing an encapsulated stack of dice 200, according to one embodiment of the present invention. The stack includes first die 270 that is mechanically and electrically attached to a first support 250, a second die 230 that is mechanically and electrically attached to a second support 210, connectors 240 such as reflowed solder balls that electrically connect the first and the second supports, and an encapsulant material 280 formed around the stack of dice. The encapsulant covers and fills at least a portion of the stack of dice and is useful for providing mechanical strength, protection, and a hermetic seal to protect against environmental moisture. As will be discussed in further detail below, the present inventors have discovered systems and methods for encapsulating the stack of dice substantially concurrently, during the same encapsulation operation. Embodiments of the present invention allow improved stacked die devices that may be fabricated by efficient methods and that may have reduced thickness to extend their uses in small electronic devices.

The stack of dice contains the first die and the second die. As used herein, the terms "die" and "dice" (dice is the plural of die) will be used to refer to portions of semiconductor material, often thin rectangular portions, having a front side on which any desired electrical circuits have been fabricated, and having a backside which may be devoid of electrical circuitry and that may be attached to a support. The terms will refer to the portions prior to encapsulation as well as in the encapsulated stack. The dice will commonly be obtained from one or more conventional semiconductor substrates or wafers that contain the desired electrical circuits formed therein by conventional approaches. Often it will be desirable to thin the semiconductor substrate to a thickness in the range of approximately 75–150 micrometers (a micrometer or micron is a unit of one-millionth of a meter), or less, in order to provide a thinner package and to allow the dice to be somewhat flexible and able to flex to relieve stresses during subsequent processing operations including encapsulation. Well-known wafer thinning techniques such as plasma etching or chemical-mechanical polishing may be used, although this is not required. After any desired thinning, which is optional, the wafer may be cut into the die portions, for example with a dicing saw.

The stack also contains the first support and the second support. As used herein, the term "die support" and "support" will be used to refer to a signaling medium that is able to mechanically and electrically connect with a die and conduct signals received from the die to another support, signaling medium, or die. In general, the support contains a signal path, often a patterned conductive material, within a non-conducting or insulating material. The patterned conductive material may be a metal line, trace, wire, or interconnect. Often, the patterned conductive material will include a highly conductive metal, such as gold, platinum, copper, copper plated with solder, copper plated with a tin-lead alloy, aluminum, or alloys thereof in order to provide a highly conductive low-resistance signaling medium. Hereafter the term metal will be used to include metal alloys and multi-layer or plated metals. However, the use of highly conductive metals is not required and other conductive materials such as less conductive metals and refractory metal silicides may also be used. Many printed circuit boards that are commonly used in the art of semiconductor die packaging are contemplated to be suitable supports. As a first example, a suitable support may contain a thin sheet of insulating polymeric material (e.g., a polyimide, epoxy, epoxy composite, bis-maleimide-triazine, cyanate ester, or other insulating polymeric) having formed thereon a patterned conductor (e.g., a patterned metal). One particular support that is suitable is a polyimide sheet having formed thereon a patterned conductive material containing copper. Another particular support that is suitable is an FR-4, or FR-5 printed circuit board comprising one or more plies of a woven-glass cloth reinforced with epoxy and containing patterned conductive material containing copper. Yet another support that is suitable is a flex tape. Of course, polymeric materials are not required. As a second example, a suitable support may contain a ceramic material containing a patterned conductive material.

The support contains encapsulant flow openings 220–225 and 260–265, which are inventive features discovered by the present inventors to allow a liquid encapsulant to flow from one side of a support to another side of a support in order to encapsulate the stack of dice. Typically, a liquid encapsulant is brought into contact with the stack of dice and is allowed to flow into, and through, the encapsulant flow openings. The inclusion of the flow openings may allow semiconductor die located at different levels of the stack to be encapsulated, and voids between different levels of the stack filled with encapsulant, substantially concurrently and in a single application of encapsulant material, rather than in separate, independent, and sequential applications of molding compounds, as found in the prior art. The encapsulation process may be operated, and the flow openings designed, so that the encapsulant is able to flow through the flow openings of the support to encapsulate the stack of dice before sufficient solidification takes place to halt further flow.

Different numbers, shapes, sizes, and positions of the openings 220–225 and 260–265 are suitable for different embodiments of the present invention. Regular shapes such as a rectangular slits, squares, triangles, or circles will often be desired, although irregular or arbitrary shapes may also be used. The openings are positioned sufficiently proximate the die to encourage the encapsulant to flow directly towards the die and cover the die without forming pockets or voids. For example, in the particular embodiment illustrated, the openings in the first support 260, 265 are positioned proximate the first die 270, on opposite sides thereof, in order to facilitate encapsulant access to both sides of the die 270. However, if highly viscous encapsulants are avoided, if sufficient pressures are employed, or if the formation of voids during encapsulation is otherwise unlikely, the openings may be positioned more distant from the die, or on a single side of the die. In the particular device shown, the flow openings are positioned outside the solder ball connectors, which may allow a small device with the connectors located in close proximity to the die, although this is not required.

The desired size and number of the openings may depend upon a number of factors. In general, larger sized encapsulant flow openings may be desired for larger fill volumes (e.g., stacked dice structures with larger void volumes to be filled with encapsulant), and for higher fill rates (e.g., filling the same void volume in a shorter period of time). A smaller flow opening may often be used if a higher pressure driving force is used to deliver the viscous encapsulant. It will be appreciated that, at least to a point, a larger encapsulant flow opening may be nearly equivalently substituted for by one or more smaller encapsulant flow openings. A particular amount of encapsulant flow in a particular period of time may be achieved by either a larger number of smaller openings or a smaller number of larger openings. The sizes of the openings may then depend upon the total opening area needed to fill the void volume of the stack of dice divided in rough proportion by the number of openings to conduct the flow of encapsulant to these void volumes.

The size and number of the openings may also depend upon rheological properties of the encapsulant. Viscosity is a well-known Theological property that characterizes the resistance of a material to flow. To illustrate, a viscous liquid like honey has a higher viscosity than water and correspondingly flows more slowly than water. Just as it may be difficult to induce honey to flow quickly through a narrow opening, it may similarly be more difficult to flow a viscous liquid through a particular opening than would be the case for a less viscous liquid. Accordingly, a larger encapsulant flow opening may be desired for a more viscous encapsulant. For some encapsulants, such as those whose viscosity quickly increases during the flowing process, it may be desirable to use a larger flow opening sufficient to achieve a certain amount of flow during a period of time before the encapsulant becomes so viscous that its resistance to flow overcomes the available pressure driving force and further flow stops prematurely before the voids of the stack of dice are filled. The viscosity of the encapsulant may increase for a number of reasons, including due to molecular weight increasing reactions, or due to cooling (viscosity generally increases with decreasing temperature).

The encapsulant is formed contiguously, in a continuous and unbroken connection, in the different void regions of the stack of dice by flowing to the regions through the plurality of encapsulant flow openings 220, 225 and 260, 265 of the respective supports 210 and 250, and solidifying in these regions. As shown, the encapsulant has solidified the surfaces of the dice, the surfaces of the support on opposite sides of the dice, between the dice, between the supports, around the connectors and within the flow openings. Once solidified, the encapsulant provides a protective and mechanically integral packaging for the dice. It is contemplated that the contiguous, seamless, and integral encapsulation of the stack of dice may provide improved strength and reduced blistering, peeling, and other separations due to thermal and mechanical stresses.

A variety of encapsulants are suitable for use with the present invention. In general, a suitable encapsulant should provide sufficient mechanical strength to hold the stack of die together during subsequent processing and use, should be a sufficiently non-conductive material to avoid unintended electrical connections between proximate conductive materials, should be compatible with the other materials used in the integrated circuit device, and should have rheological properties that allow it to flow through the encapsulant flow openings and stack of dice without forming voids that would impede proper operation of the device. Many conventional molding compounds, epoxy molding compounds, filled epoxy molding compounds, and other materials commonly used for packaging semiconductor die are suitable, and commercially available from a number of sources.

According to one embodiment of the present invention, the encapsulant contains a fast curing polymer material, such as a phenol-formaldehyde Novolac-type epoxy resin, containing one or more fillers or other additives to modify the encapsulants theological, thermo-mechanical, dielectric, or other properties. This particular encapsulant may be prepared by combining appropriate conventional proportions of an epoxide, such as epichlorohydrin, with one or more curing materials, such as phenol and formaldehyde, and with varying desired amounts of filler, such as silica. Such filled epoxies are commonly used in the semiconductor processing arts and their properties are well known.

The filler may be added in varying proportion in order to modify, for example, the coefficient of thermal expansion of the encapsulant so that it is sufficiently similar to that of the semiconductor die so that the encapsulant and the die thermally expand and contract together to avoid potentially damaging mechanical stresses due to changes in temperature. This may help to maintain contact and integrity between the die and the encapsulant. In one instance, the silica may be added as particles having an average diameter of around 10 micrometers and in an amount that is around 75–90 wt %. This particular filler may also be replaced by other such as fine or powdered sand, quartz, silicon dioxide, clay, or the like.

Such a resin and filler may have a viscosity that is in the range of approximately 50–200 poise before significant curing, at an encapsulation temperature of that is in the range of approximately 170–180° C. The encapsulant viscosity may be measured, for example by determining the flow of the encapsulant in a circular tube of a capillary viscometer, or by another desired technique. The resin may cure by way of molecular weight increasing reactions that increase the viscosity of the encapsulant, restrict its ability to flow, and eventually lead to solidification of the encapsulant. The reactions may proceed with a gel time that is often less than a minute at temperatures between about 170–180° C.

Figure 3:
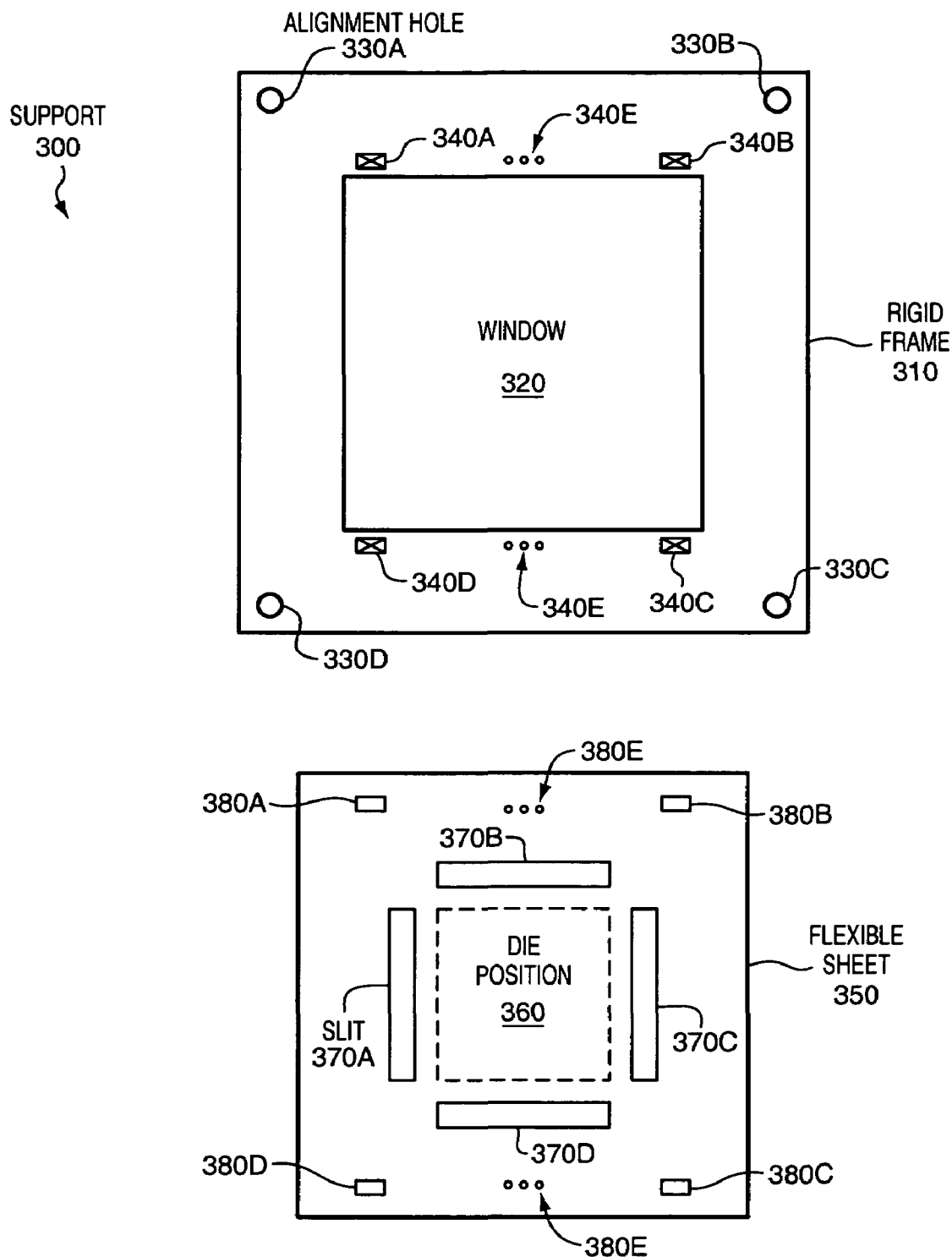
FIG. 3 shows a top view of a die support that includes a rigid frame and a flexible sheet, according to one embodiment of the present invention.

FIG. 3 shows a top view of a die support 300 that includes a rigid frame 310 and a flexible support sheet 350, according to one embodiment of the present invention. The support sheet may be attached to the frame in order to facilitate handling of the flexible support sheet and then the die may be attached to the framed support sheet.

The frame 310 may contain a number of rigid materials. Suitable materials include metals (e.g., copper, aluminum, stainless steel, chrome, titanium, etc.), ceramics, graphite, plastics (e.g., polyethylene, styrene, fiberglass, composites, etc.), and other materials. The frame contains a window opening 320 to expose a portion of the flexible support sheet 350 containing a die position 360 and encapsulant flow slits 370A–D when the support sheet is properly attached to the frame. The frame contains optional alignment holes 330A–D located in its corners. The holes may be drilled, cut, punched, or otherwise formed. Jigs such as guide pins or rods may be inserted into the alignment holes 330A–D and into the alignment holes of another frame in order to align the frames relative to one another and establish and mechanically maintain a desired relationship between the frames and dice positioned and supported thereon. In one instance the alignment holes may allow aligning one frame to another with a tolerance of about 30 micrometers, or better, although this is not required. Alternatively, the die may be aligned manually, such as by using the outer perimeter of the frame as a guide. Even if the alignment holes are desired, it is not necessary to include all four holes. The frame additionally contains alignment teeth 340A–D to align the support sheet relative to the frame. The alignment teeth may be similar to the sprocket teeth to couple with perforations in the film in a camera to advance the film, although there is no requirement that the teeth be on a cylindrical surface. Four teeth are shown in the particular embodiment, although less teeth or more teeth 340E may also be used.

The flexible support sheet 350 may contain a flexible version of a support as previously described. For example, the flexible support sheet may comprise a flexible insulating material containing a conductive signaling medium. Suitable flexible support sheets include polymeric sheets containing patterned conductive material, flexible printed circuit boards, flexible FR-4 sheets, flexible FR-5 sheets, flex tape, and the like. The flexible support sheet may desirably be thin, to facilitate fabrication of a thin, low-cost device. The sheet contains alignment openings or perforations 380A–D and optionally 380E that respectively correspond to the alignment teeth 340A–D and 340E. In one instance the teeth and openings allow a sheet to be aligned relative to a frame with a tolerance of about 30 micrometers, or better, although this is not required.

The sheet also contains four encapsulant flow slits 370A–D positioned in proximate the die attach position 360, along all four sides thereof, to allow encapsulant flow to the die position. The present inventors have found that elongated rectangular slits, such as those shown, may provide good distribution of encapsulant around the die position and may additionally relieve stresses in the sheet and in an attached die, although it is to be appreciated that the slits are not required and may be replaced by squares, circles or other openings. The slits may have a length that is a significant portion of the semiconductor die to be attached and may have a width that is sufficient to allow a particular encapsulant to flow through all available openings to fill the voids of a stack of dice within an acceptable period of time. It will be appreciated that, at least to an extent, an increase in width may allow a decrease in length, and visa versa. In one particular embodiment, a die has length and width of about 13 millimeters, and the slits 370A–D have a length that is in the range of approximately 50–100% the length of the die, and a width that is in the range of approximately 0.5–2.0 millimeters or approximately 0.75–1.25 millimeters for an encapsulant such as the filled epoxy resin discussed above that has a viscosity that is in the range of approximately 50–200 poise. Of course smaller widths may be used for less viscous encapsulants and larger sized slits may be used for more viscous encapsulants. The appropriate sizes for the openings may be determined empirically through tests on different sized openings, or may be determined by fluid flow modeling or simulation. In the particular embodiment illustrated, a slit is provided along each of the four sides of the die position, although this is not required.

The slit and teeth perforation openings in the support sheet may be formed by a variety of approaches. In the case of a thin flexible support sheet, it may be convenient to form the openings and slits by puncturing or pressurized cutting of the sheet with a shearing action that tears the sheet. This may resemble the shearing action employed by a conventional hole puncher used for ordinary paper sheets. For example, the slits may be punched or punctured. Alternatively, the openings could be cut, drilled, or formed by other known approaches.

Figure 4:
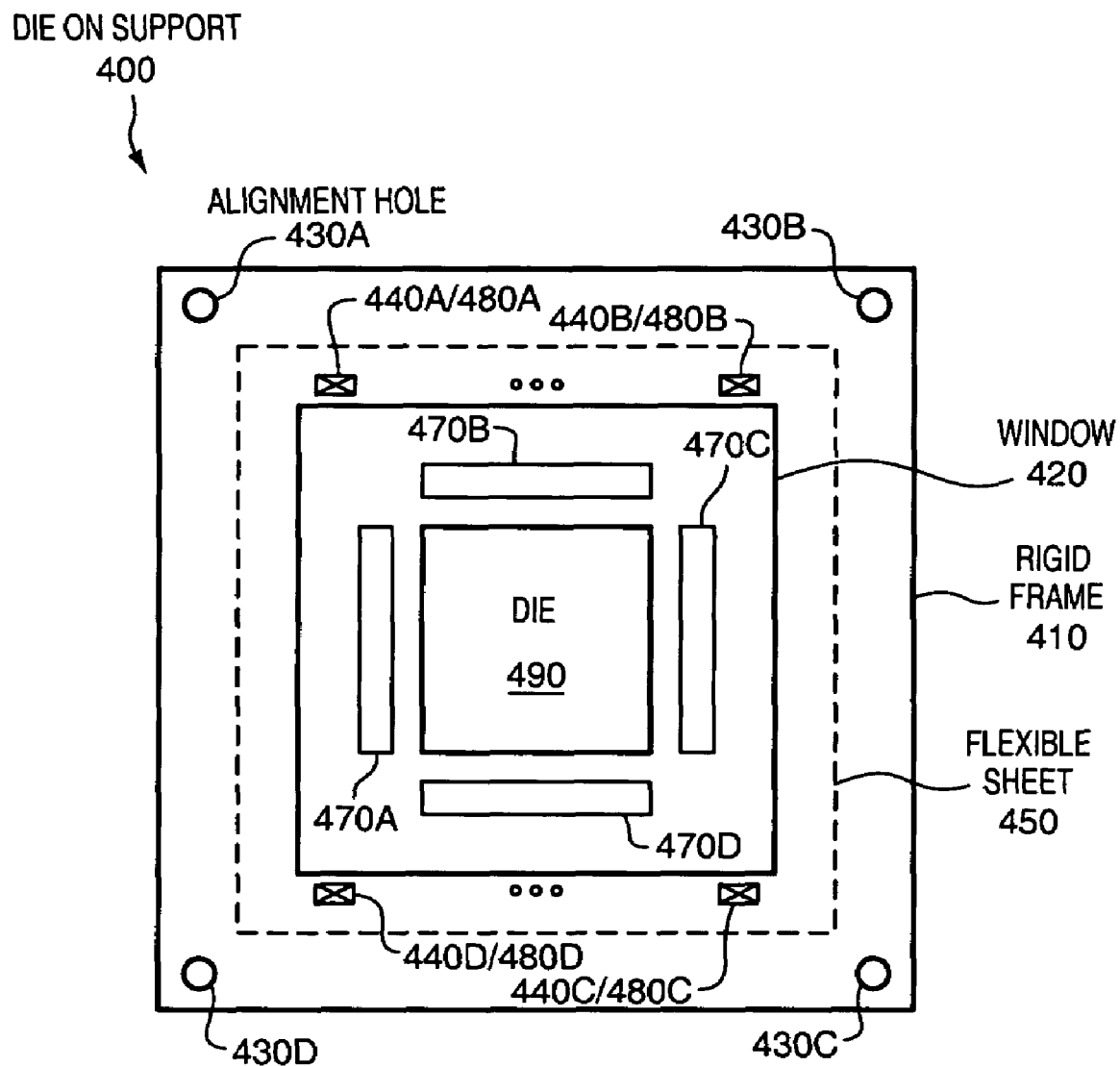
FIG. 4 shows a top view of a die attached to the assembled support of FIG. 3, according to one embodiment of the present invention.

FIG. 4 shows a top view of a die 490 attached to the assembled die support 300 of FIG. 3, according to one embodiment of the present invention. The support is assembled by inserting the jig teeth 440A–D of the frame into the openings 480A–D of the flexible support sheet to align the support sheet with the frame. An adhesive may be used to further attach the sheet to the frame. This places the die position 460 and the slits 470A–D within the window 420 of the frame. The die 490 may then be attached to the die position 460.

Figure 5:
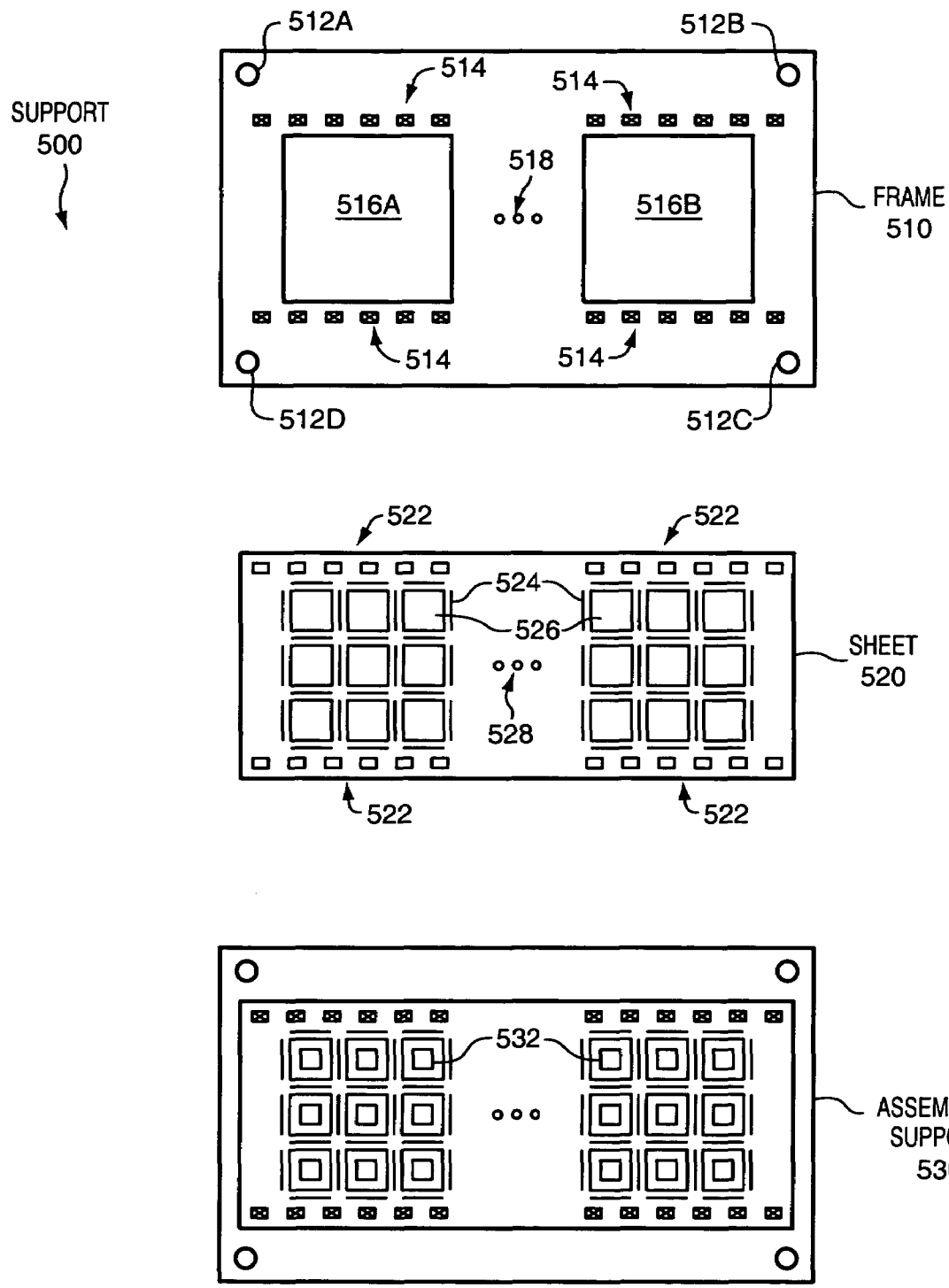
FIG. 5 shows a top view of a support in un-assembled and assembled formats, according to one embodiment of the present invention.

It will be appreciated that in a manufacturing environment it may be desirable to concurrently encapsulate a number of stacked die structures in a single molding operation. FIG. 5 shows such a suitable support 500, according to one embodiment of the present invention. The support contains a frame 510 and a flexible support sheet 520. The frame and support sheet contain features that may be similar to those shown in FIG. 4, including alignment holes 512A–D, teeth 514, windows 516A–B, openings for teeth 522, encapsulant flow slits 524, and die positions 526. Two slits and die positions are identified, although it is to be appreciated that 48 slits and 18 die positions are shown. As indicated by identifiers 518 and 528, the support may contain any desired additional teeth, windows, teeth openings, slits, and die positions.

FIG. 5 also shows dice 532 on an assembled die support 530, according to one embodiment of the present invention. In the particular illustration, 18 dice 532 are attached to the support sheet at the corresponding 18 die attachment positions 526. The assembled die support may be stacked on other analogous supports, with or without alignment using the alignment openings 512A–D, so that the 18 dice are stacked relative to a corresponding set of 18 dice on another supports. The multiple stack of dice may be placed in an encapsulation chamber, concurrently encapsulated, and cut and formed into 18 integrated circuit devices containing encapsulated stacks of dice.

Figure 6:
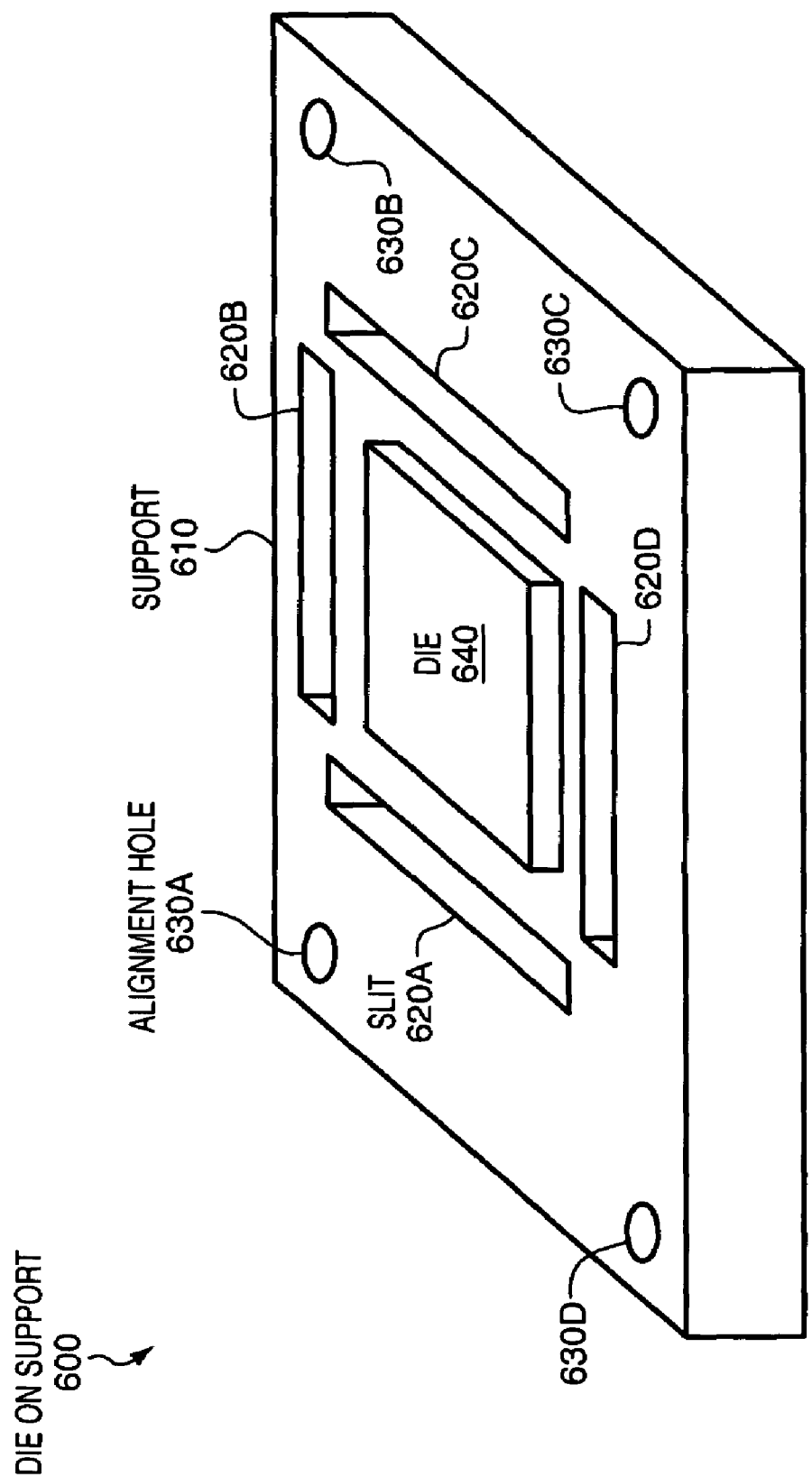
FIG. 6 shows a side-perspective view of a die on a rigid or inflexible support, according to one embodiment of the present invention.

According to an alternate embodiment of the present invention, the support may comprise a sufficiently rigid material and no frame. FIG. 6 shows a side-perspective view of a die 640 on a sufficiently rigid support 610, according to one embodiment of the present invention. The support 610 need not be completely rigid although it may be sufficiently inflexible to allow ease of handling. Suitable supports include among others rigid organic substrates containing polymerics such as FR-4, FR-5 bis-maleimide-triazine (BT), cyanate ester, or others. Composite glass fibers may be added to the polymeric material to help provide rigidity, as desired. The support contains slits 620A–D and optional alignment holes 630A–D. Each of these openings may be formed during the molding process, if the support is molded, or cut, drilled, pressed, punctured, or otherwise formed in the support. In the case of a brittle material, such as certain ceramic supports, it may be desirable to slowly drill or cut the supports, rather than by any sort of abrupt puncturing, to avoid cracking or damaging the support. Ceramic supports may be more costly than the organic supports, although this may be acceptable depending upon the particular implementation.

Figure 7:
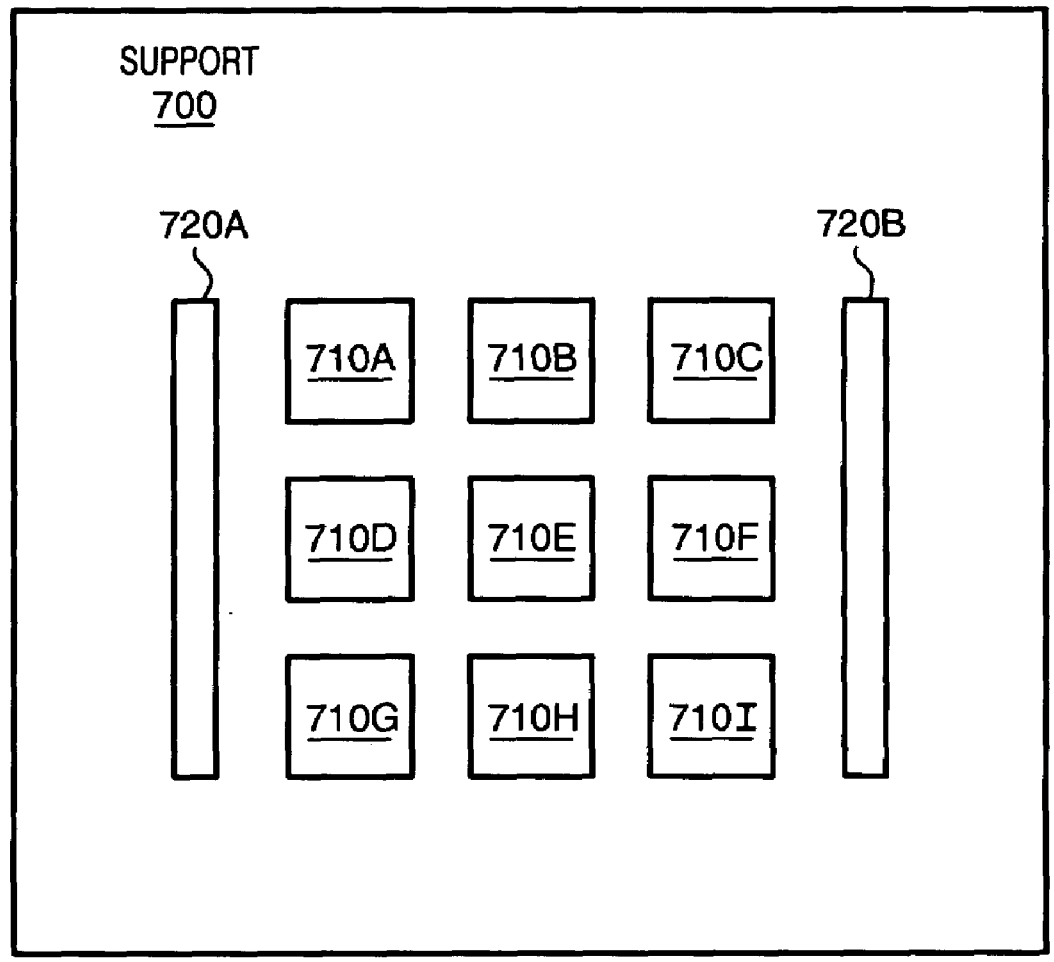
FIG. 7 shows a top view of a support containing encapsulant flow slits formed at opposite sides of the intended positions of a set of dice, according to one embodiment of the present invention.

The present inventors contemplate a variety of types of flow openings and arrangement of flow openings relative to die attach positions. FIG. 7 shows a top view of a support containing one exemplary configuration wherein slits 720A–B are formed at opposite sides of the intended positions 710A–I of a set of dice. The slits may have greater length and width compared to those shown in FIG. 6 in order to facilitate flow of the encapsulant over dice attached at the positions 710A–I. In yet another alternate embodiment, the slits 720A–B may be avoided, and the die position 710E may be replaced with an encapsulant flow opening having a square or circular shape with approximately the same size as a die. It will be appreciated by a person having an ordinary level of skill in the art and the benefit of the present disclosure that many different encapsulant flow openings and arrangements of the openings on a support are contemplated and fall within the scope of the present invention.

Figure 8:
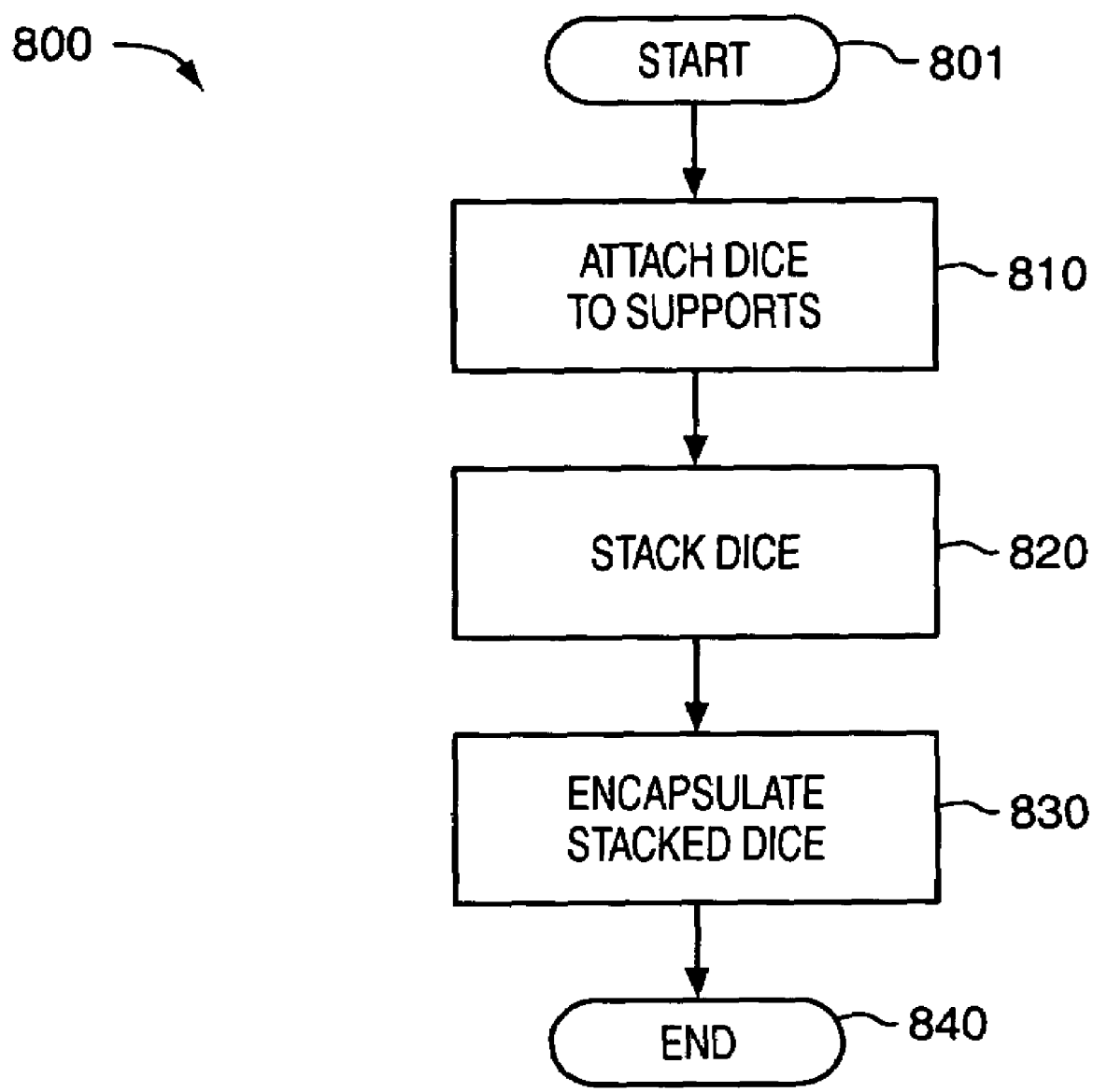
FIG. 8 shows a method for encapsulating a stack of dice, according to one embodiment of the present invention.

FIG. 8 shows a method 800 for encapsulating a stack of dice, according to one embodiment of the present invention. After commencing at block 801, the dice are mechanically and electrically attached to the supports at block 810. This may include mechanically and electrically attaching a first and second die to a first and a second support, respectively. The die may be placed and adhered to the support with an adhesive, and electrically connected by approaches that are suitable and known for the particular die and support. Common approaches for electrically connecting the die and the support include wire bonding, lead bonding, tape automated bonding (TAB), and flip-chip bonding, although these are not required. In one exemplary embodiment of the present invention, tape automated bonding is used to electrically connect the connection pads of a die to a flexible printed circuit board support.

After attaching the dice to their respective supports at block 810, the dice may be stacked at block 820. This may include stacking the first and the second supports so that the first die is directly over the second die. In one embodiment of the present invention, an alignment system may be used to help align the supports so that the first die is precisely aligned relative to the second die, although this is not required. One exemplary alignment system includes inserting one or more pins, rods, or other members through alignment openings in the support. Stacking the dice may also include perfecting or completing an electrical connection between the dice. For example, in an embodiment of the present invention wherein the underside (the side opposite the die attach side) of the first support contains solder balls, formed for example by a solder screen forming or printing process, the solder balls may be heated in a conventional solder reflow process in order to wet the solder balls to the connection pads and provide good electrical connection.

After stacking the dice at block 820, the stacked dice are encapsulated at block 830. According to one embodiment of the present invention, the stacked dice may be placed in an encapsulation chamber and a liquid encapsulant may be added to the chamber under suitable conditions (e.g., temperature, pressure, flow rate, etc.) so that the encapsulant flows around the stack of dice and solidifies. The encapsulant may flow to, contact, conform to, solidify, and encase the stack of dice within the chamber. In this way, the stack of dice may be encapsulated substantially concurrently. In a typical embodiment of the present invention, encapsulating the stack of dice may include flowing liquid encapsulant from one side of a support to another opposite side through an inventive encapsulant flow opening in the support. The flow opening may allow semiconductor die located at different levels of the stack to be encapsulated and voids between different levels of the stack filled with encapsulant during a single application of encapsulant material. Encapsulating the stack of dice may also include solidifying encapsulant within the encapsulant flow opening.

Figure 1:
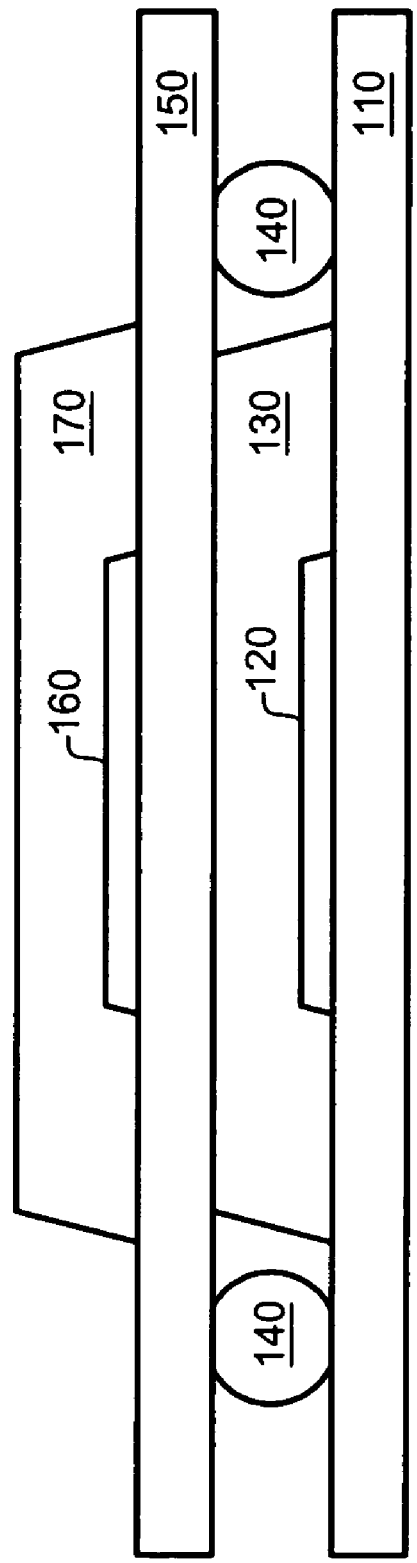
FIG. 1 shows a cross-sectional view of a package that contains a stack of separately molded silicon die.

The present method for encapsulating a stack of dice offers a number of advantages. Compared to the prior art method discussed for fabricating the package shown in FIG. 1, the present method for encapsulating a stack of dice is efficient and has eliminated several costly operations. One simplification is elimination of the separate and independent over-moldings of the first and the second die. Another simplification is the elimination of the described planarization operations. These simplifications may translate into less manufacturing equipment, less handling operations, and/or improved manufacturing throughput, and overall reduced manufacturing costs.

Additionally, embodiments of the present invention may allow fabricating thinner devices than are possible with prior art approaches. As discussed, the prior art approach often involves planarization operations to remove excess unnecessary molding compound overlying the dice. Typically some of the extra unnecessary molding compound is left in situ as a buffer or tolerance to avoid over planarization. As discussed elsewhere herein, in an embodiment of the present invention, frames having a particular predetermined thickness may be used to provide a predetermined separation distance or gap between the supports of the stack so as to provide a substantially minimal thickness of encapsulant material between the stacked supports, which should allow fabrication of a thinner encapsulated stack of dice. These thinner stacks should be particularly useful for inclusion in small-sized electronic communication devices such as cell phones, pagers, and the like.

Figure 9:
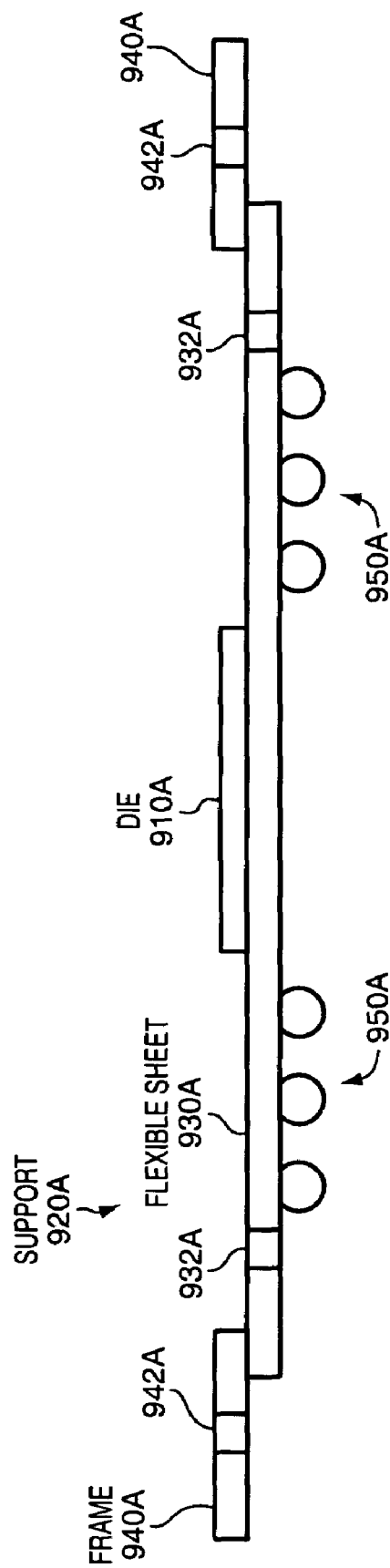
FIG. 9 shows a cross-sectional view of a die attached to a support comprising a flexible sheet held in a rigid frame, according to one embodiment of the present invention.
Figure 10:
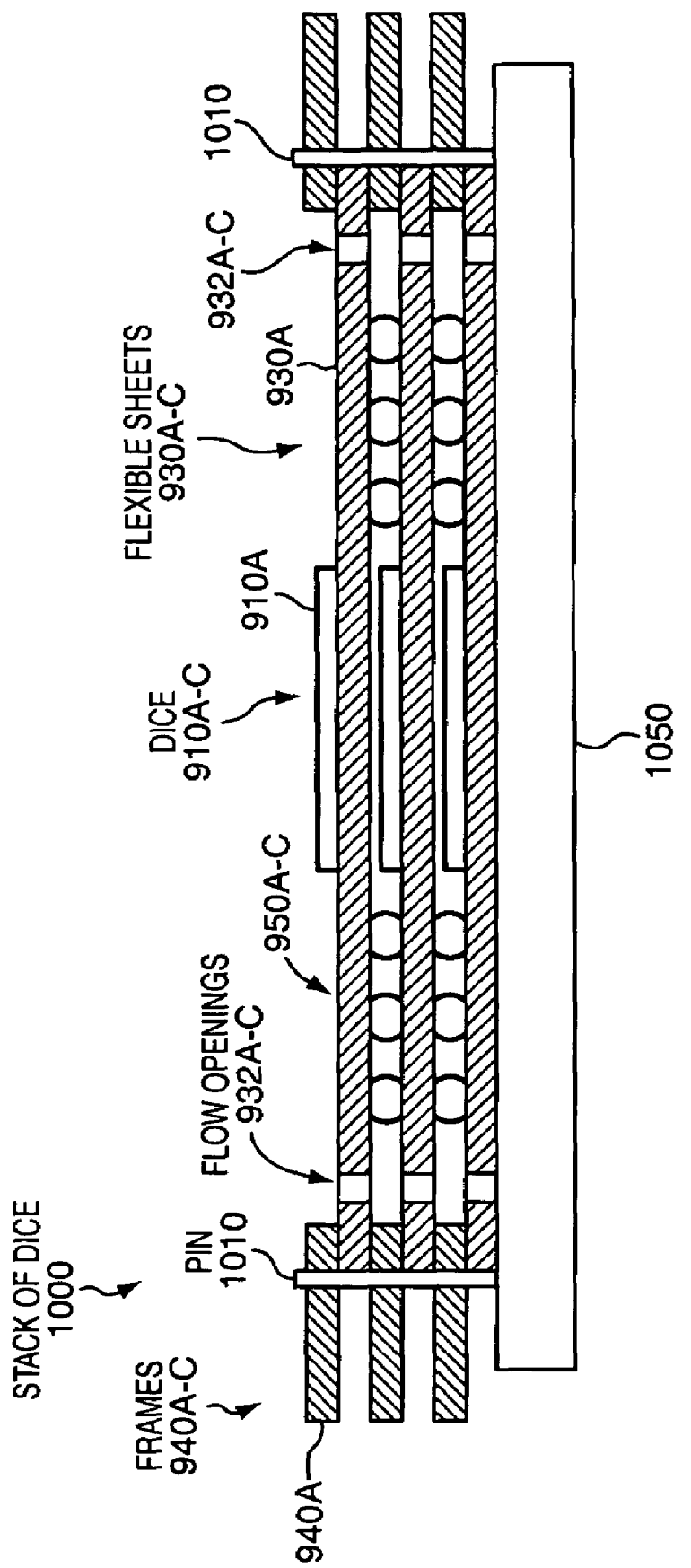
FIG. 10 shows a cross-sectional view of a stack of three dice attached to their respective supports and stacked with the use of an alignment system, according to one embodiment of the present invention.
Figure 13:
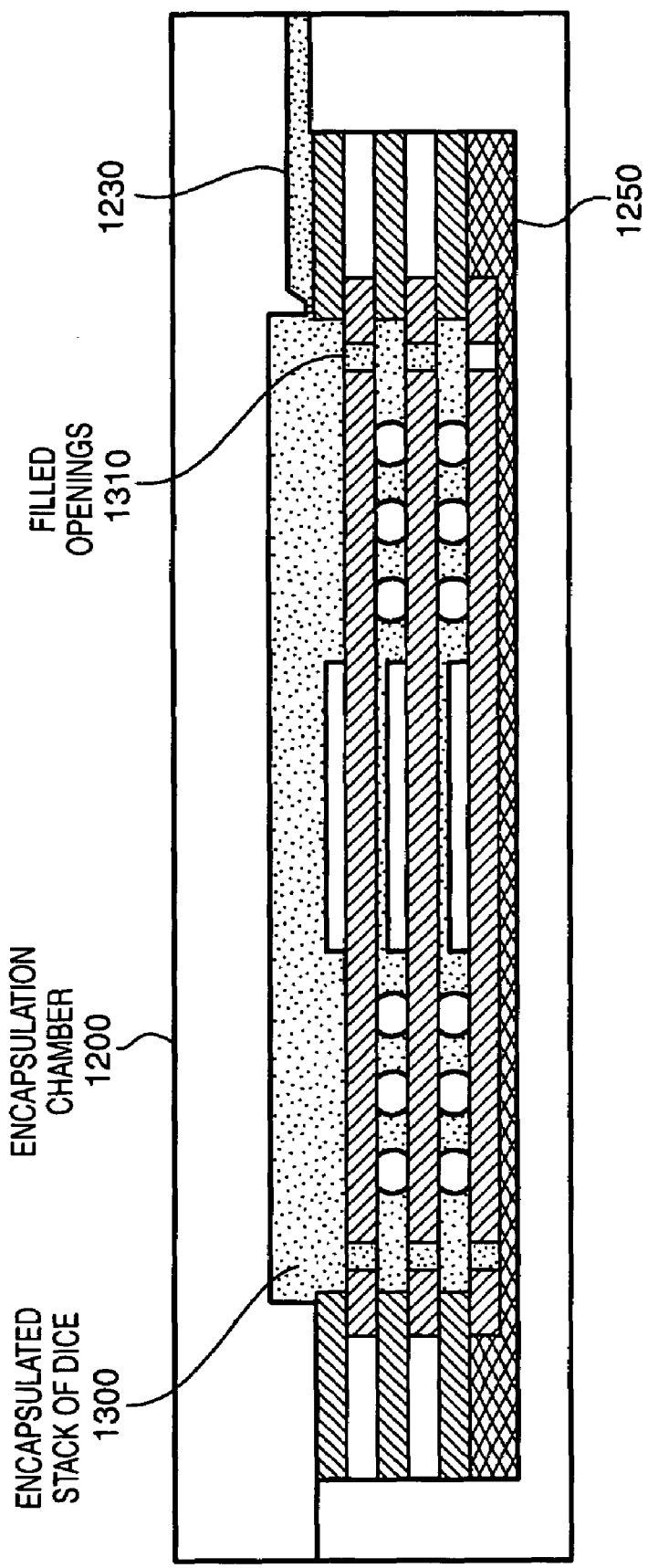
FIG. 13 shows a cross-sectional view of the stack of dice of FIG. 12 after encapsulation, according to one embodiment of the present invention.
Figure 14:
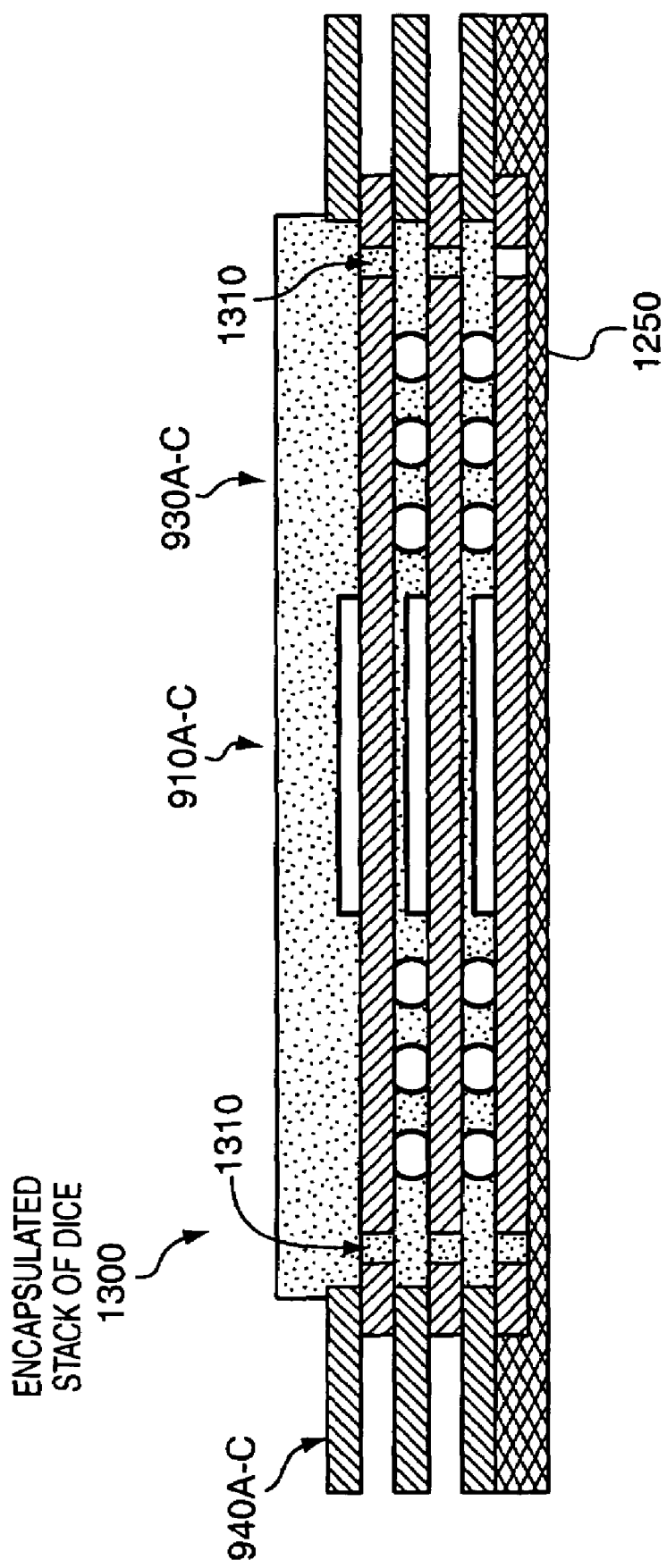
FIG. 14 shows a cross-sectional view of the encapsulated stack of dice of FIG. 13 after removal from the encapsulation chamber, according to one embodiment of the present invention.
Figure 15:
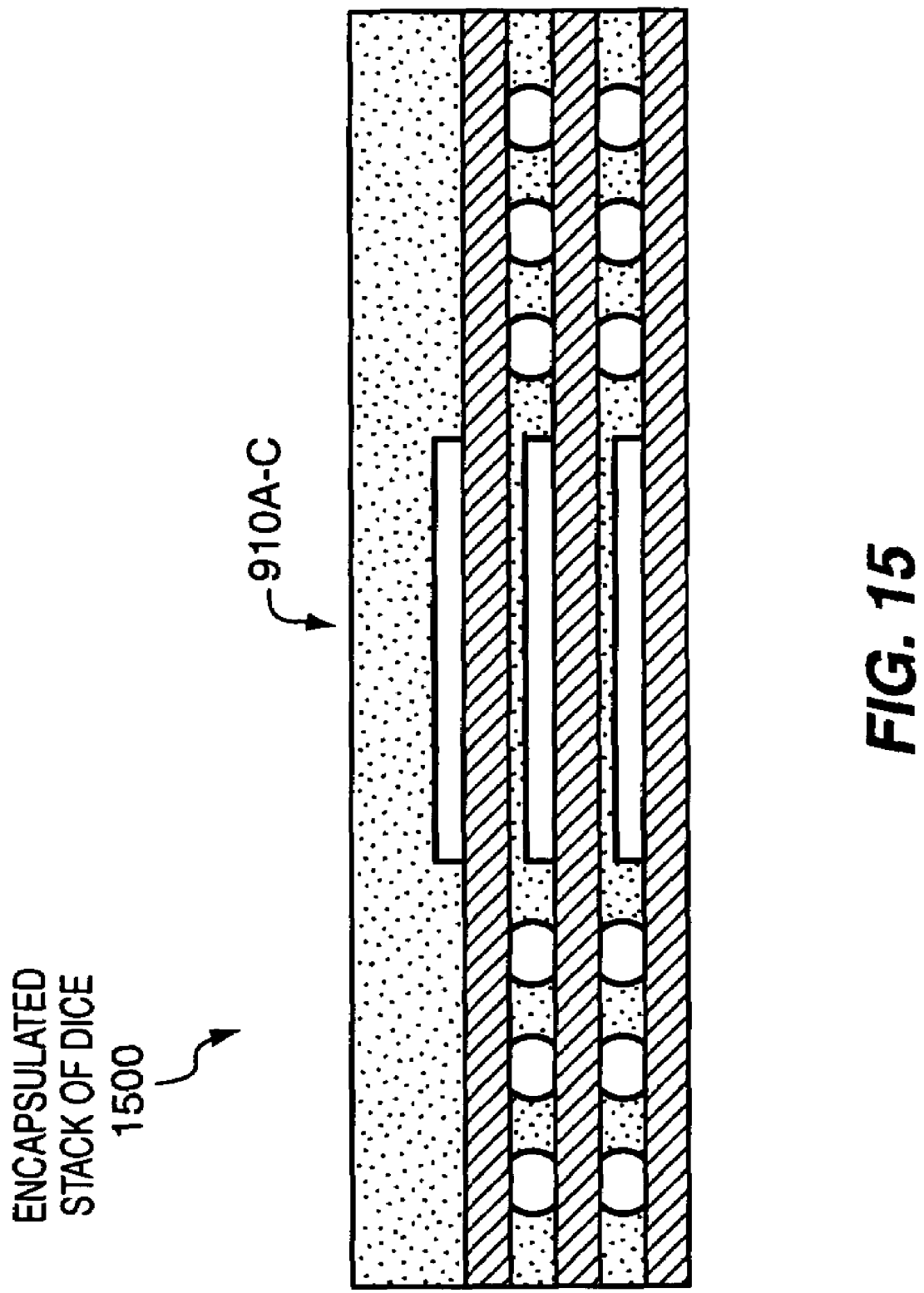
FIG. 15 shows a cross-sectional view of an encapsulated stack of dice device formed by removing the release tape and excess encapsulant and support materials from the periphery of the stack of dice of FIG. 14, according to one embodiment of the present invention.

FIGS. 9–15 show cross-sectional views representing different stages of a method for forming the encapsulated stack of dice shown in FIG. 15, according to one embodiment of the present invention. In particular, FIG. 9 shows attaching a die to a support, FIG. 10 shows stacking dice, and FIGS. 11–14 show encapsulating a stack of dice.

FIG. 9 shows a cross-sectional view of a die 910A attached to a support 920A comprising a flexible support sheet 930A held in a frame 940A, according to one embodiment of the present invention. The die is attached near the center of an upper surface of the sheet. The sheet contains encapsulant flow openings 932A located proximate and on opposite sides of the attached die. The openings may allow encapsulant to flow from either a top or bottom side of the sheet to the opposite side. Solder balls 950A are provided on the bottom surface of the sheet between the die and the flow openings. The sheet contains patterned conductive materials (not shown) to carry electrical signals from the attached die to the solder balls. The openings do not need to be positioned outside of the solder balls, although this may facilitate encapsulating small-sized devices. The sheet may be attached to the frame by adhesives or other desired fastener. The frame may have a thickness that is sufficiently similar to, or less than, the diameter of the solder balls so that the solder balls may provide contact between an underlying and an overlying support. In one particular instance wherein conventional solder screen printing is used to form balls with a solder ball height bump of about 125 micrometers, the thickness of the frame may be less than the solder ball bump height and not so small as to allow over collapse of the balls during solder reflow. For example, the thickness of the frame may be in the range of approximately 100–125 micrometers. The frame contains optional alignment openings 942A on opposite frame ends that may be used to align the frame with another frame positioned either over or under the frame.

FIG. 10 shows a cross-sectional view of a stack of three dice 1000 attached to their respective supports and stacked with the use of an alignment system, according to one embodiment of the present invention. The stack contains three dice 910A–C attached to their respective supports, which in this case are flexible sheets 930A–C drawn over rigid frames 940A–C, and stacked into alignment. Notice that in this particular embodiment the die are stacked without first applying a molding compound. The frames are stacked into alignment with the assistance of an alignment system containing jigs such as vertical guide pins 1010 inserted into frame alignment openings and attached to a base 1050 that holds the guide pins in fixed positions. After aligning the frames, pressure may be applied to force the frames into contact, to provide a fixed predetermined spacing between the flexible sheets and die, and to reduce or eliminate any warp. In the embodiment shown, solder balls of a particular diameter are used to electrically connect the flexible sheets to one another, and the frame thickness has been designed so that it is sufficiently close to the solder ball diameter so that the solder balls may be formed into connection with upper and lower supports. The frame thickness helps avoid solder over collapse during a subsequent solder heating to provide good electrical contact and connection between the supports. If desired, flow cleaning may be performed through the inter-frame gap to remove flux It is an aspect of one embodiment of the present invention that the stack of semiconductor dice, including the exposed bare semiconductor surfaces of the dice be encapsulated simultaneously and concurrently during a single encapsulation operation in a single encapsulation chamber. Such an encapsulation may offer advantages such as process simplification, reduction of processing operations, reduction of processing equipment, and reduced manufacturing process time. Such benefits may reduce the total cost for packaging multi-die integrated circuit devices and may make the encapsulation process better suited for high-volume manufacturing.

Figure 11:
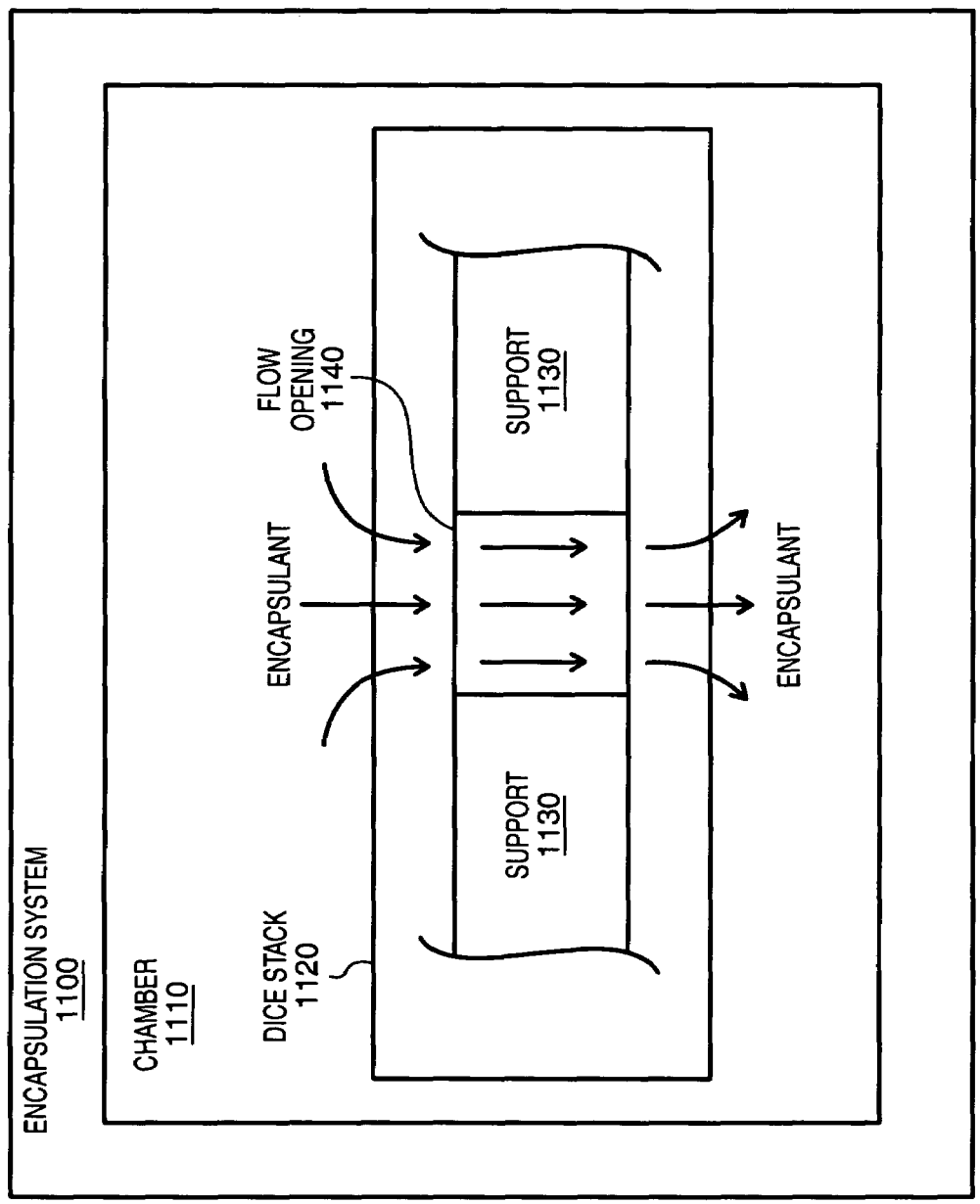
FIG. 11 shows an encapsulation system to encapsulate a stack of dice, according to one embodiment of the present invention.

FIG. 11 shows an encapsulation system 1100 to encapsulate a stack of dice, according to one embodiment of the present invention. The system contains a chamber 1110 to accommodate a stack of dice 1120. The system may be a conventional and commercially available transfer molding system. Transfer molding has been used in the semiconductor arts for decades to package circuits and there is a generally high level of skill in the art of transfer molding compounds and materials, machines, tooling, methodologies, and overall know-how for transfer molding a package. Transfer molding involves heating an encapsulant, such as epoxy resin precursors, to a reactive temperature state at or just below the encapsulants cure temperature, injecting the encapsulant into the mold, and curing the encapsulant. The curing may be perfected by adding additional heat through the mold to accelerate the rate of reaction or by allowing additional time for the curing reactions to achieve completion. Pressure may be provided through compressional members, hydraulics, a ram, a plunger, a reciprocating screw, or a pump to improve filling of the mold. In one particular embodiment of the present invention, the inventors contemplate using a TOWA Y-Series system, available from TOWA Corporation of Kyoto Japan, which may provide approximately sixty tons of pressurization, or a comparable system.

Depending on the characteristics of the encapsulant (e.g., viscosity) the use of vacuum may be desired for very small confined spaces between supports in the stack. The vacuum may be obtained by performing the encapsulation in a chamber of a conventional vacuum assisted transfer molding system. Such systems are commercially available or may be created by connecting a vacuum pump with the chamber and providing a suitable seal for the chamber to handle a low level of vacuum. A low level of vacuum, such as around 10 kilo Pascals, is usually sufficient, although higher levels of vacuum may also be used. Such vacuum may help promote flow of the encapsulant into tight regions of the stack structure and may reduce voids or gas filled pockets.

Other encapsulation systems and chambers are also suitable. For example, other conventional molding systems, compression molding systems, injection molding systems, reaction-injection molding systems, thermoset molding systems, and their chambers may be used as encapsulation systems and chambers.

After placing the stack of dice 1120 in the chamber 1110 encapsulant may be added to the chamber under suitable conditions that allow it to flows into the stack of dice including through a flow opening 1140 in a die support 1130. After the encapsulant has been allowed to flow into and through the opening it may be solidified, either through thermosetting reaction or cooling, as a rigid, mechanically integral and protective package for the stack of dice. After solidification, and any desired cooling, the encapsulated package may be removed from the chamber.

Figure 12:
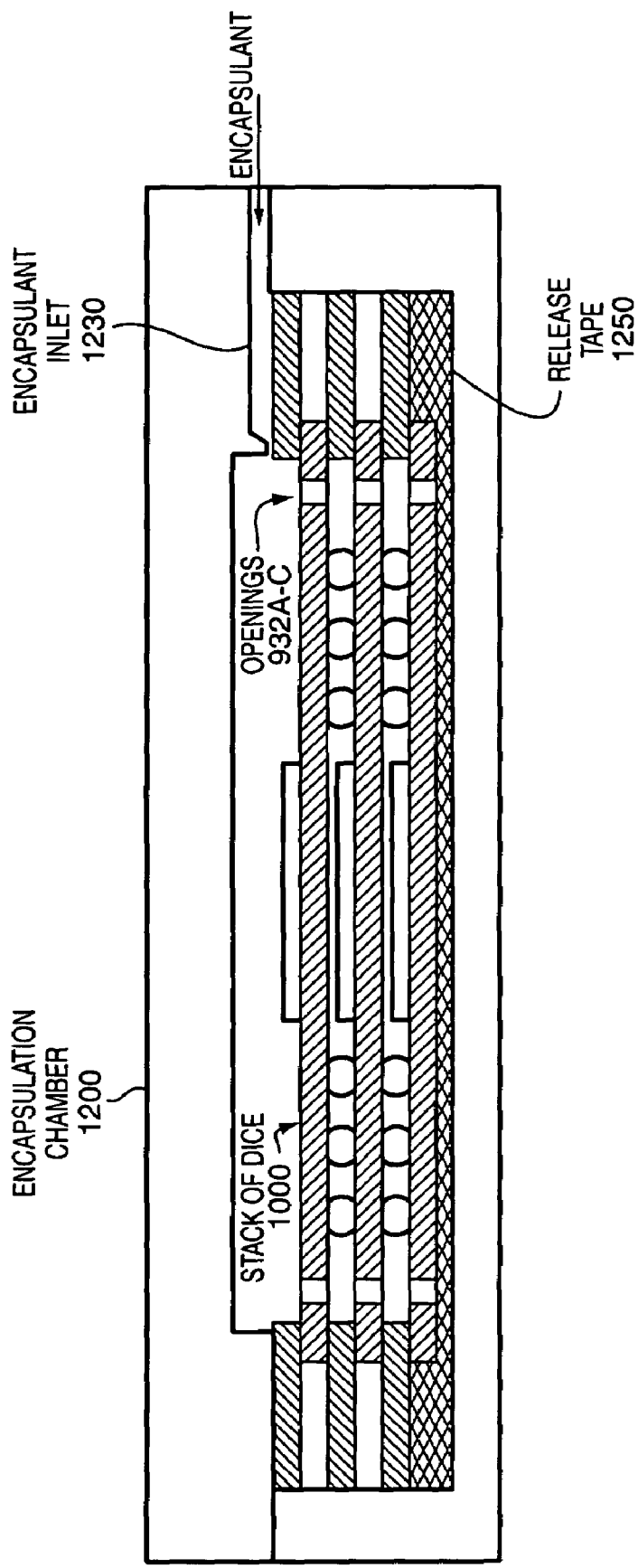
FIG. 12 shows a cross-sectional view of the stack of dice of FIG. 10 placed in an encapsulation chamber, according to one embodiment of the present invention.

FIG. 12 shows a cross-sectional view of a stack of dice 1000 placed in an exemplary encapsulation chamber 1200, according to one embodiment of the present invention. Encapsulant may be added through an inlet 1230. A distributor may be used to achieve good flow distribution of the encapsulant. After its introduction into the chamber, the encapsulant may flow over the topmost support, over the die attached to the topmost support, through the openings 1240, and into other unoccupied regions of the stack of dice until it is sufficiently filled. Flow openings may allow encapsulant that is introduced over the topmost support to flow into the region between the topmost support and the middle support, and between the middle support and the bottom support. As shown, a release tape 1250 may be provided beneath the stack of dice. The release film may prevent the encapsulant from flowing beneath the bottom support so that electrical connections may be made post-encapsulation to the bottom surface of the bottom support.

FIG. 13 shows a cross-sectional view of the stack of dice of FIG. 12 after encapsulation by flowing encapsulant into the void regions and solidifying the encapsulant. The encapsulated stack of dice 1300 contains encapsulant formed around the voids of the stack of dice 1000 within the chamber 1200. As shown, the encapsulant contiguously encapsulates and mechanically connects the stacked dice structure together concurrently and in the same molding operation. The encapsulant also occupies the filled flow openings 1310. The ability to encapsulate the die and physically connect the stack layers in one concurrent molding operation may significantly improve the efficiency of the manufacturing process by reducing the number of molding operations that need to be performed to complete the structure and by significantly reducing the amount of handling and movement of the package components. This may help reduce packaging time and costs, allow increased throughput, and perhaps reduce the initial investment cost for manufacturing equipment by allowing a reduction in the number of encapsulation systems and related handling systems needed to make a stacked die package. Additionally, the present inventors have found that the encapsulation may reduce the height of the packaged stack, which may translate into use of the packages in smaller sized electronic devices (e.g., smaller cellular phones).

Although performing the encapsulation of the stack of dice in an encapsulation chamber is presently favored, it is not a requirement of all embodiments of the present invention. In an alternate embodiment of the present invention, it is contemplated that encapsulating a stack of dice may include dipping a stack of dice into a volume of a sufficiently non-viscous liquid encapsulant material, and thereafter solidifying the liquid encapsulant that remains in the stack of dice by cooling or irradiation. In yet another alternate embodiment of the present invention, it is contemplated that encapsulating a stack of dice may include pouring a sufficiently non-viscous liquid encapsulant over a stack of dice, including pouring or flowing the liquid encapsulant through an encapsulant flow opening in a support.

FIG. 14 shows a cross-sectional view of the encapsulated stack of dice of FIG. 13 after removal from the chamber, according to one embodiment of the present invention. The release tape is still attached and may thereafter be removed.

FIG. 15 shows a cross-sectional view of an encapsulated stack of dice device 1500 formed by removing the release tape 1250 and excess encapsulant and support materials from the periphery of the stack of dice 1300 of FIG. 14, according to one embodiment of the present invention. Often solder balls (not shown) or other connections may be formed on the bottom of the encapsulated stack of dice. Next, excess materials, outside of the regions of electrical connections between the die and the support and between the plurality of supports, have been removed. The excess material may be removed by cutting or sawing with a dicing saw. In the particular embodiment illustrated the filled encapsulant flow openings have been cut away. This may be desirable if a small-sized device is desired. However, in another embodiment of the present invention the filled encapsulant flow openings, or some point thereof, may be kept by removing excess materials that are outside of regions containing the filled openings. This may help increase the mechanical integrity and connection of the layers. A cross section of the encapsulated stack of dice may indicate a seamless encapsulation across multiple layer supports. The cross section may also lack the adhesives that are often used in prior art approaches to affix separately overmolded dice and support to one another.

Figure 16:
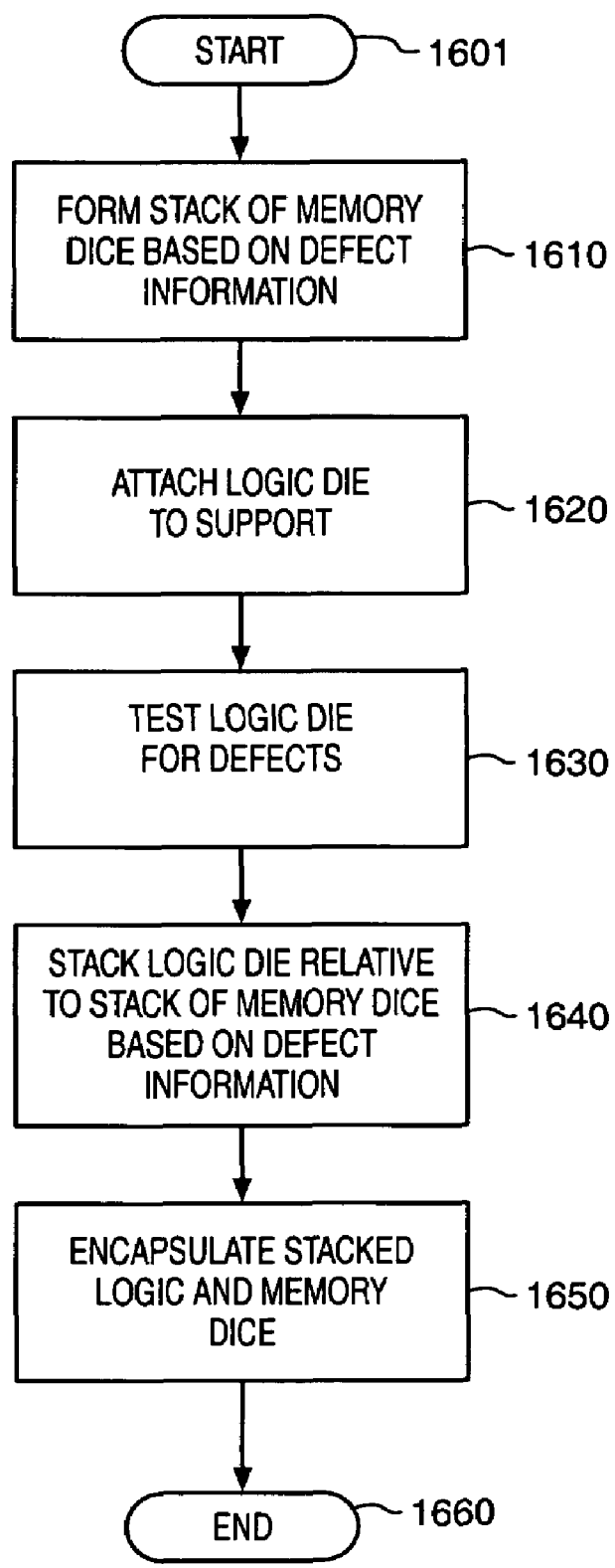
FIG. 16 a method for encapsulating stacked logic and memory dice, according to one embodiment of the present invention

FIG. 16 shows a method for encapsulating stacked logic and memory dice, according to one embodiment of the present invention, in which it is desired to test the logic die prior to concurrent encapsulation with the memory dice, in order to improve manufacturing yields and reduce costs. The concepts of the method are illustrated with a particular exemplary device containing an encapsulated stack of a logic die stacked over two memory dice, although the method is more generally applicable.

After initials at block 1601, a stack of memory dice is formed based on defect information at block 1610. Initially, silicon wafers containing logic die and a first and second memory die are thinned to approximately 75 micrometers by a conventional backgrinding process, then the logic die and the two memory die (e.g., two Flash memory die) are cut from the wafers with a dicing saw.

Suitable supports such as these described herein are obtained for these die. The die may be attached to supports as previously described.

The stack may be formed based on defect information. Each frame may contain an identifier, such as a bar code, in order to identify the frame and its associated die support and allow recording defect and other information about dice located at particular predetermined locations relative to the frame. In one particular embodiment, a support may contain indications or markings of die positions that are defective (e.g., a defective tape automated bonding site). The support supplier may provide these indications, for example as known markings on the support that may be detected by a pattern recognition system, or they may be determined by testing. The locations of these defective sites may be recorded in a file (a record of data or a datastructure in machine-readable format) that may be associated with the frame through the identifier or bar code. The file may be used and referred to while picking and placing die on the support. For example, defect free die may not be placed on a defective die position, while defective die or "dummy" die may or may not be placed on a defective die position, as desired. Of course, stacks containing defective or dummy die would be identified as such and would later be separated.

The one or more memory die maybe pick and placed on a first support in a first frame, based on consultation with the support's file to avoid placing the die on defective sites, and the die maybe bonded to the support with adhesives. The use of this defect information may help improve manufacturing yields and reduce costs. Electrical connections maybe established and testing maybe used to determined defective memory die, and memory die that are free of defects. The memory die may be tested using a common test socket or individual test socket, as desired. Defect information maybe added to the file associated with this frame. Similarly, one or more memory die maybe pick and placed on a second support in a second frame based on consultation with a file for the second support and based on consultation with the file for the first support. Consulting these files for defect information may help reduce yield losses due to defective sites in the first and second supports and due to defective memory die in the first support. The memory die on the second support may be tested, and resulting defect information added to the file for the second support.

After picking and placing and attaching the dice to the supports based on detect information, the supports may be stacked, with or without alignment. As desired, pressure may be applied to reduce warp and solder heating with or without flux cleaning may be used to improve electrical connections between the dice.

At block 1620 logic die are attached to a suitable support (of course this may also be done before block 1610). One or more logic die may be pick and placed on a third support in a third frame, based on consultation with a file for the third support to avoid placing the logic die on a defective site of the third support. In one instance, wire bonding may be used to electrically connect the logic die to the third support, although this is not required and alternate electrical connection approaches may also be used. Next, the logic die and the wire bonding may be molded to the support, for example with an epoxy molding compound or another suitable encapsulant material as described herein, in order to protect the wire bonding. According, in some embodiments of the present invention, a die may molded prior to encapsulation in a stack.

After attaching the logic die at block 1620, the logic die may be tested for defects at block 1630. The present inventors have recognized that manufacturing yields for defect free logic die will often be less than those for memory die, and have discovered methods for fabricating a device containing a logic die that includes testing the logic die prior to encapsulation with other die, such as memory die, in order to improve manufacturing yields and reduce costs. The logic die may be tested and burned in prior to stacking. In an embodiment wherein multiple logic die are formed on the support, for example in the arrangement shown in FIG. 5, the multiple logic die may be tested using a common test socket for the support, or alternatively, the logic die may be singularized and tested using an individual package test socket. The testing may indicate whether a logic die is defective, or free of defects. Defect information for each of the logic die may be recorded to the file and maintained in association with the logic die.

Next, the logic die are stacked relative to the stack of memory dice based on defect information at block 1640. The present inventors contemplate using the testing information and defect information obtained for the logic die to pick and place the logic die on the stack of memory dice. Logic die that are free of defects may be picked and placed relative to defect free stacks of the stacked memory dice, based on consultation with the files for the first and second frames. Advantageously, this testing prior to incorporating the logic die into the device stacks may avoid placing a defective logic die over good memory die on the first and second supports. Additionally, this consultation of the files for the memory die supports may avoid placing a good logic die over a defective memory die position or over a defective memory die.

After picking and placing the logic die, electrical connections may be created between the logic die and the stack of memory die. In one embodiment of the present invention the logic die are stacked over the underlying memory die so that external pads of the logic die may be electrically connected to the external pads of the stacked memory. The first support may contain solder balls that may be heated by conventional approaches to wet and electrically connect to electrical connection pads on the underlying support for the memory die. Flux cleaning may be performed, as desired.

After stacking at block 1640 the stacked logic and memory dice are encapsulated at block 1650. The stacked logic and memory dice may be placed in a chamber, vacuum or otherwise, and a liquid encapsulant may be flowed into the chamber, through flow openings in one or more of the supports, and over the dice. In this way the logic die and the memory die may be encapsulated and mechanically connected together.

The method of encapsulation terminates at block 1660, although a person having an ordinary level of skill in the art, and the benefit of the present disclosure, will appreciate that other operations may often be performed, as desired. For example, solder balls or other connections may be formed on the underside of the support for the lower memory die that forms the underside of the encapsulated stack of dice. Then, encapsulated stacked dice devices may be cut or singularized with a dicing saw or other suitable cutting device. Testing, further packaging, and other operations may be performed, as desired.

Figure 17:
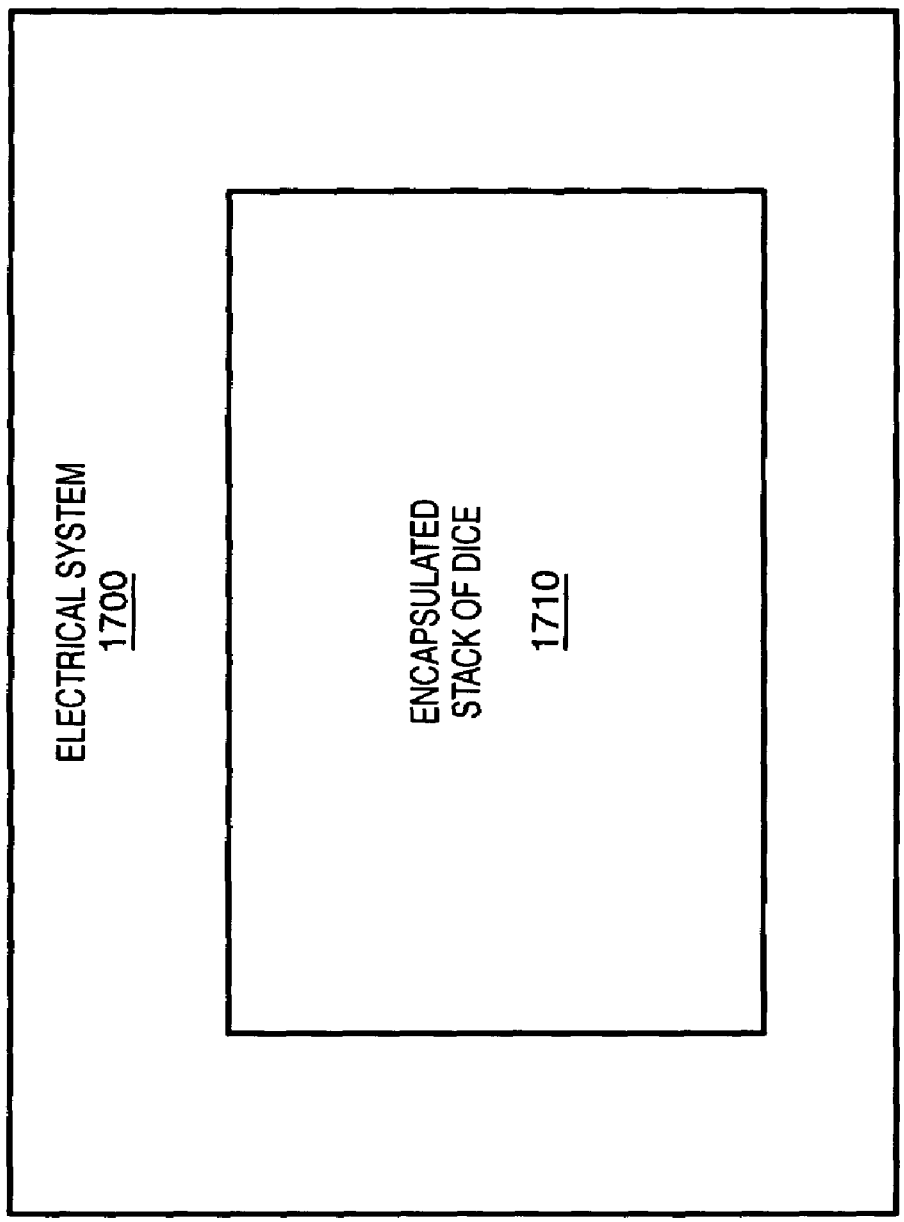
FIG. 17 shows an encapsulated stack of dice contained within an electrical system, according to one embodiment of the present invention.

FIG. 17 shows an electrical system 1700 containing an encapsulated stack of dice 1710, according to one embodiment of the present invention. The electrical system may be a computer system (e.g., a personal digital assistant, palmtop, laptop, or desktop computer), a mobile communication system (e.g., a cellular phone or pager), among others. The encapsulated stack may contain an integrated circuit, such as a microprocessor, micro-controller, memory, Flash memory, or communication chip. In one particular embodiment of the present invention, the electrical system is a compact mobile communication system, such as a cellular phone, and the encapsulated stack contains a memory die and a logic die encapsulated together concurrently during a single encapsulation operation to form a device that has a length and a width that are both less than approximately 20 millimeters and a thickness less than approximately 1 millimeter.

Thus, integrated circuit devices containing encapsulated stacks of dice, and the systems and methods for encapsulating the stacks of dice, have been described. While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    forming a stack of semiconductor dice; and
    encapsulating the stack of semiconductor dice by flowing a liquid encapsulant through a plurality of encapsulant flow openings in a printed circuit support, where the openings are proximate to, and on all four sides of, a position of attachment of a die to the printed circuit support, and by solidifying the liquid encapsulant in the openings.

2. The method of claim 1, wherein said flowing the encapsulant through the openings comprises flowing the encapsulant through an encapsulant flow opening having a rectangular, square, circular, or triangular shape.

3. The method of claim 1, wherein said flowing the encapsulant through the openings comprises flowing the encapsulant through a slit.

4. The method of claim 1, wherein said flowing the encapsulant through the openings comprises flowing the encapsulant from one side of the printed circuit support to another.

5. The method of claim 1, wherein said forming the stack of semiconductor dice comprises attaching dice to the printed circuit support based at least in part on die defect information.

6. The method of claim 1, wherein said forming the stack of semiconductor dice comprises forming a stack of semiconductor dice that includes Flash memory, and further comprising including the encapsulated stack of semiconductor dice in a mobile communication system.

7. A method comprising:
    attaching a die to a flexible printed circuit that is held in a rigid frame, the flexible printed circuit including an encapsulant flow opening;
    stacking a second die relative to the die to create a stack of semiconductor dice; and
    encapsulating the stack of the semiconductor dice by flowing an encapsulant through the encapsulant flow opening, and solidifying the encapsulant in the opening.

8. The method of claim 7, wherein said flowing the encapsulant through the opening comprises flowing the encapsulant through a slit having a width between 0.5–2 millimeters and a length that is greater than 2 millimeters.

9. The method of claim 7, further comprising flowing the encapsulant through a first plurality of encapsulant flow openings in the flexible printed circuit that are each proximate a first die attach position and flowing the encapsulant through a second plurality of encapsulant flow openings that are each proximate a second die attach position.

10. The method of claim 7, wherein the die and the second die have bare semiconductor surfaces during said stacking.

11. The method of claim 7, wherein the second die is stacked relative to the die based at least in part on die defect information and die attach position defect information.

12. The method of claim 7, further comprising:
    placing the stack of semiconductor dice in an encapsulation chamber,
    adding liquid encapsulant to the chamber; and
    flowing the liquid encapsulant from the encapsulation chamber through the encapsulant flow opening.

13. The method of claim 7, wherein flowing the encapsulant through the opening comprises flowing the encapsulant through an opening having a shape selected from a rectangular, square, circular, or triangular shape.

14. The method of claim 7, wherein said attaching the die to the flexible printed circuit comprises attaching a die having Flash memory, and further comprising including the encapsulated stack of semiconductor dice in a mobile communication system.

15. A method comprising:
forming a stack of semiconductor dice; and
encapsulating the stack of semiconductor dice by flowing a liquid encapsulant through a plurality of encapsulant flow openings through a printed circuit support, and solidifying the liquid encapsulant in the openings, where the openings are proximate a die attach position of the printed circuit support and are on opposite sides of the die attach position, and wherein the openings include a slit.

16. The method of claim 15, further comprising forming an encapsulant flow opening of the plurality in the printed circuit support by an approach selected from punching, puncturing, cutting, and drilling.

17. The method of claim 15, wherein said forming the stack comprises forming a stack that includes a Flash memory, and further comprising including the encapsulated stack of semiconductor dice in a cellular phone.

18. A method comprising:
forming a stack of semiconductor dice; and
encapsulating the stack of semiconductor dice by flowing an encapsulant through encapsulant flow openings in a printed circuit support, and solidifying the encapsulant in the openings, where the openings are proximate a die attach position of the printed circuit support, are on opposite sides of the die attach position, and are on all four sides of the die attach position.

19. The method of claim 18, further comprising forming an encapsulant flow opening of the plurality in the printed circuit support by an approach selected from punching, puncturing, cutting, and drilling.

20. The method of claim 18, wherein said forming the stack comprises forming a stack that includes a Flash memory, and further comprising including the encapsulated stack of semiconductor dice in a cellular phone.

21. A method comprising:
attaching a first die to a first printed circuit having a first encapsulant flow opening;
attaching a second die to a second printed circuit having a second encapsulant flow opening;
stacking the first die attached to the first printed circuit over the second die attached to the second printed circuit;
after said stacking, flowing an encapsulant through the first encapsulant flow opening from one side of the first printed circuit to another, flowing the encapsulant through the second encapsulant flow opening from one side of the second printed circuit to another; and
solidifying the encapsulant over and around the first die and the second die and in the first and second encapsulant flow openings.

22. The method of claim 21, wherein said flowing the encapsulant through the first encapsulant flow opening comprises flowing the encapsulant through an opening having a rectangular, square, circular, or triangular shape.

23. The method of claim 21, wherein said attaching the first die to the first printed circuit comprises attaching the first die to a printed circuit held in a rigid frame.

24. The method of claim 23, further comprising aligning the first and the second die by using alignment holes of the frames.

25. The method of claim 21, wherein said attaching the first die and the second die comprises attaching the dice based, at least in part, on die defect information.

26. The method of claim 21, wherein said attaching the first die comprises attaching the first die to the first printed circuit between a plurality of encapsulant flow openings of the first printed circuit.

27. The method of claim 21, wherein the first die comprises Flash memory, and further comprising placing the encapsulated stack in a mobile communication system.

* * * * *